(12) United States Patent
Chiu et al.

(10) Patent No.: US 12,214,385 B2
(45) Date of Patent: Feb. 4, 2025

(54) METHOD FOR CLEANING SEMICONDUCTOR PROCESS EQUIPMENT AND SYSTEM THEREOF

(71) Applicants: Chun-Jung Chiu, New Taipei (TW); Chun-Hsiung Chen, New Taipei (TW); Wan-Chen Chuang, New Taipei (TW)

(72) Inventors: Chun-Jung Chiu, New Taipei (TW); Chun-Hsiung Chen, New Taipei (TW); Wan-Chen Chuang, New Taipei (TW)

( * ) Notice: Subject to any disclaimer, the term of this patent is extended or adjusted under 35 U.S.C. 154(b) by 0 days.

(21) Appl. No.: 17/979,795

(22) Filed: Nov. 3, 2022

(65) Prior Publication Data

US 2023/0141790 A1     May 11, 2023

(30) Foreign Application Priority Data

Nov. 5, 2021 (TW) ................................ 110141279

(51) Int. Cl.
*B08B 7/00* (2006.01)
*B08B 7/04* (2006.01)
*B08B 13/00* (2006.01)
*H01L 21/67* (2006.01)

(52) U.S. Cl.
CPC .............. *B08B 7/0042* (2013.01); *B08B 7/04* (2013.01); *B08B 13/00* (2013.01); *H01L 21/67028* (2013.01)

(58) Field of Classification Search
None
See application file for complete search history.

(56) References Cited

U.S. PATENT DOCUMENTS

| | | | |
|---|---|---|---|
| 2004/0103917 A1 | 6/2004 | Heerens | |
| 2009/0108190 A1* | 4/2009 | Plewa | B82Y 10/00 250/251 |
| 2011/0111533 A1 | 5/2011 | Varadarajan et al. | |
| 2021/0035700 A1* | 2/2021 | Tseng | H01L 21/67028 |
| 2021/0039102 A1* | 2/2021 | McLeod | G02B 27/0012 |

FOREIGN PATENT DOCUMENTS

| | | |
|---|---|---|
| TW | I576657 B | 4/2017 |
| TW | I760133 B | 4/2022 |

* cited by examiner

*Primary Examiner* — Eric W Golightly
(74) *Attorney, Agent, or Firm* — Chun-Ming Shih; LANWAY IPR SERVICES

(57) ABSTRACT

A method for cleaning semiconductor process equipment and a system thereof are provided. The method is adapted to apply to an object with at least one pollutant thereon and includes steps of providing multi-channel optical tweezers to irradiate the pollutant and locations where the pollutant is neighbor to, in order to let the optical tweezers generate a resultant force to the pollutant; and providing an airflow to the object. The resultant force is greater than a maximum static friction between the pollutant and the object so as to remove the pollutant.

4 Claims, 7 Drawing Sheets

---

Providing multi-channel optical tweezers to irradiate a pollutant, in order to let the optical tweezers generate a resultant force to the pollutant — S1

Providing an airflow to an object — S2

METHOD FOR CLEANING SEMICONDUCTOR PROCESS EQUIPMENT AND SYSTEM THEREOF

TECHNICAL FIELD

The present disclosure is related to a method for cleaning semiconductor process equipment and a system thereof, more particularly to the method and system to eliminate pollutions/particles of the semiconductor process equipment.

BACKGROUND

In the semiconductor manufacturing process, an exposure process is an important procedure. That is, a photomask with a pattern is disposed beyond a wafer, continuously an exposure light source emits light on the wafer also through the mask. After that, the wafer is immersed in a developing solution, so as to see the pattern of the photomask on the wafer.

A photomask protective film is on the mask, in order to prevent the pattern from being scratched and to prevent the contamination on reticle that affects exposure yield. Besides, since the photomask protective film may be adhered to pollutions/particles, chemical substances, etc. by the static electricity, so that a procedure of eliminating dust to the photomask protective film is a must. However, when the pollutions/particles are attached to the photomask protective film, a bonding force between the pollutions/particles and the photomask protective film is very strong, so it is known that cleaning methods in prior arts cannot easily remove the pollutions/particles on the photomask protective film.

Thus, how to overcome the problem of easily removing the pollutions/particles on the photomask protective film becomes an issue to people having ordinary skill in the art.

SUMMARY

The objective of the present disclosure provides a method for cleaning semiconductor process equipment, and it can effectively remove pollutants on photomasks or photomask protective films.

The method for cleaning semiconductor process equipment, adapted to apply to a photomask protective film of a photomask with at least one pollutant thereon, comprises steps of: providing multi-channel optical tweezers to irradiate the pollutant and locations where the pollutant is neighbor to, in order to let the optical tweezers generate a resultant force to the pollutant; and then providing an airflow to the photomask protective film; wherein the resultant force is greater than a maximum static friction between the pollutant and the object.

The other objective of the present disclosure provides a system for cleaning semiconductor process equipment, and it can effectively remove pollutants on photomasks or photomask protective films.

The system for cleaning semiconductor process equipment, adapted to apply to an object with at least one pollutant thereon, comprises a light source, a beam expander, a spatial light modulator and a monitoring module, wherein the light source emits an initial light, the beam expander adjusts the initial light to a main laser light when the initial light enters therein, continuously the spatial light modulator adjusts the main laser light to multi-channel optical tweezers when the main laser light enters therein, and the monitoring module electrically connects to the spatial light modulator and shoots and obtains a position of the pollutant, then transmits the position of the pollutant to the spatial light modulator. In addition, the optical tweezers irradiate the pollutant and locations where the pollutant is neighbor to, in order to let the optical tweezers generate a resultant force to the pollutant.

The present disclosure has the advantage that the method for cleaning semiconductor process equipment and the system thereof can effectively remove pollutants/particles on photomasks or photomask protective films, and it is highly recommended for eliminating dust.

The accompanying drawings are incorporated in and constitute a part of this application and, together with the description, serve to explain the principles of the disclosure in general terms. Like numerals refer to like parts throughout the disclosure.

BRIEF DESCRIPTION OF THE DRAWINGS

The objects, spirits, and advantages of the preferred embodiments of the present disclosure will be readily understood by the accompanying drawings and detailed descriptions, wherein:

FIG. 3A illustrates a schematic view of multi-channel optical tweezers L1, L2 irradiating the pollutant 7 and locations where the pollutant 7 are neighbor to;

DETAILED DESCRIPTION

In order to describe in detail the technical content, structural features, achieved objectives and effects of the instant application, the following detailed descriptions are given in conjunction with the drawings and specific embodiments. It should be understood that these embodiments are only used to illustrate the application and not to limit the scope of the instant application.

Figure 1A:
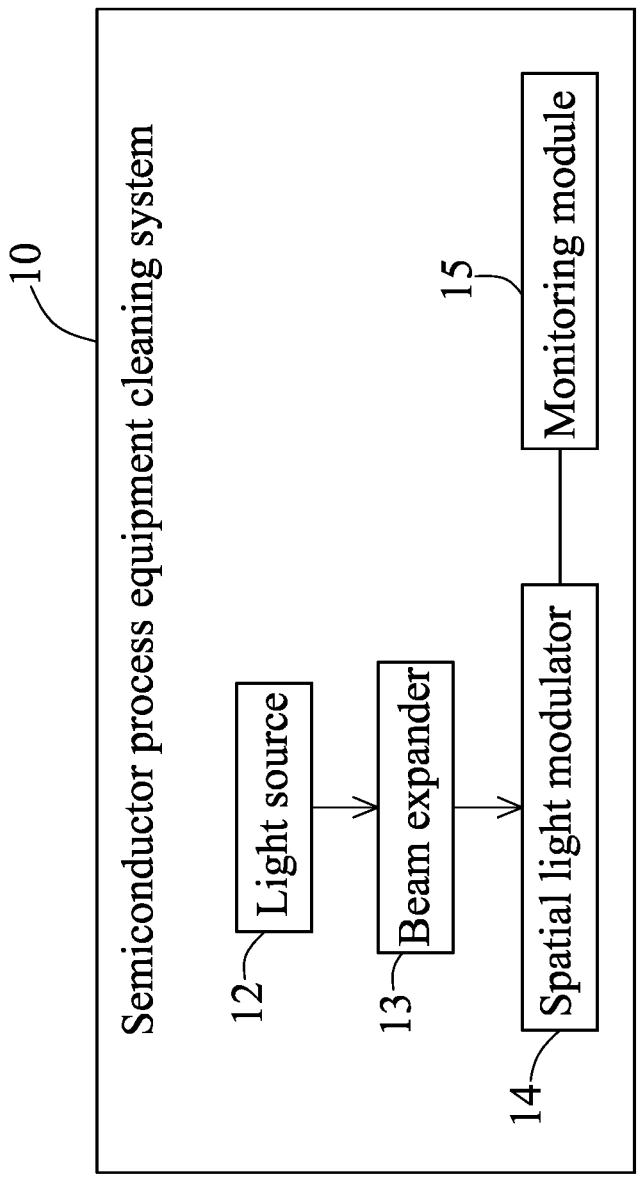
FIG. 1A illustrates a schematic block diagram of an embodiment of a cleaning system 10 for cleaning semiconductor process equipment of the present disclosure.
Figure 1B:
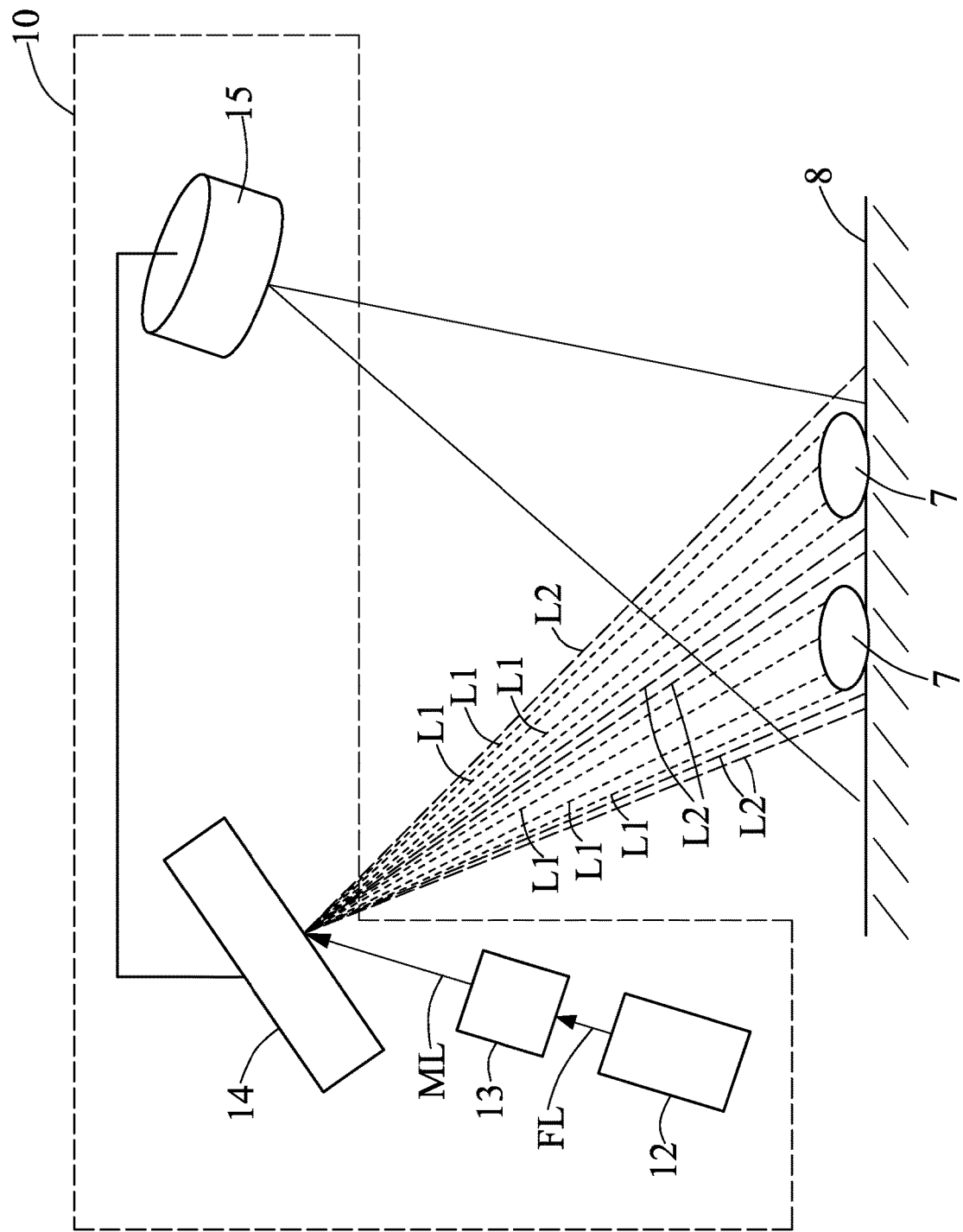
FIG. 1B illustrates a schematic view of a cleaning system 10, a pollutant 7 and an object 8 of the semiconductor process equipment of the present disclosure.

With reference to FIG. 1A and FIG. 1B, which illustrate a schematic block diagram of an embodiment of a cleaning system for cleaning semiconductor process equipment of the present disclosure, and a schematic view of a semiconductor process equipment cleaning system 10, a pollutant 7 and an object 8 of the semiconductor process equipment of the present disclosure. The cleaning system 10 is adapted to apply to the object 8, which is as a photomask or a photomask protective film, and at least the pollutant 7 is attached to the object 8. In addition, the particle diameter of the pollutant 7 is normally not less 5 nm.

The cleaning system 10 of the semiconductor process equipment includes a light source 12, a beam expander 13, a spatial light modulator 14, and a monitoring module 15. The beam expander 13 is between the light source 12 and the spatial light modulator 14. The monitoring module 15 is electrically connected to the spatial light modulator 14. For the embodiment, the light source 12 and the beam expander 13 are two individual devices; for other embodiments, the beam expander 13 is integrated in the light source 12.

Accordingly, the light source 12 emits an initial light (FL) to an inside of the beam expander 13, then the initial light (FL) is adjusted by the beam expander 13 to a main laser light (ML). The main laser light (ML) goes into the spatial light modulator 14 continuously. Besides, the spatial light modulator 14 is to divide the main laser light (ML) into two multi-channel laser tweeters, which are a laser tweeter L1 and a laser tweeter L2. How to divide the main laser light (ML) into the two multi-channel laser tweeters L1, L2 will be described later.

Refer to FIG. 1B, the monitoring module 15 may be a CCD camera or a CMOS camera, in order to shoot and obtain a position of the pollutant 7. After the position of the pollutant 7 is learned by the monitoring module 15, and the monitoring module 15 transmits it to the spatial light modulator 14. Then the spatial light modulator 14 focuses the multi-channel laser tweezer L1 on the pollutant 7, and also focuses the multi-channel laser tweezer L2 on places where are neighbor to the pollutant 7, after the position of the pollutant 7 is confirmed.

Aforesaid embodiment discloses the basic structures of the cleaning system 10 of the semiconductor process equipment and the operation mode of each component. Following will describe the main effects of the cleaning system of the semiconductor process equipment.

Figure 2A:
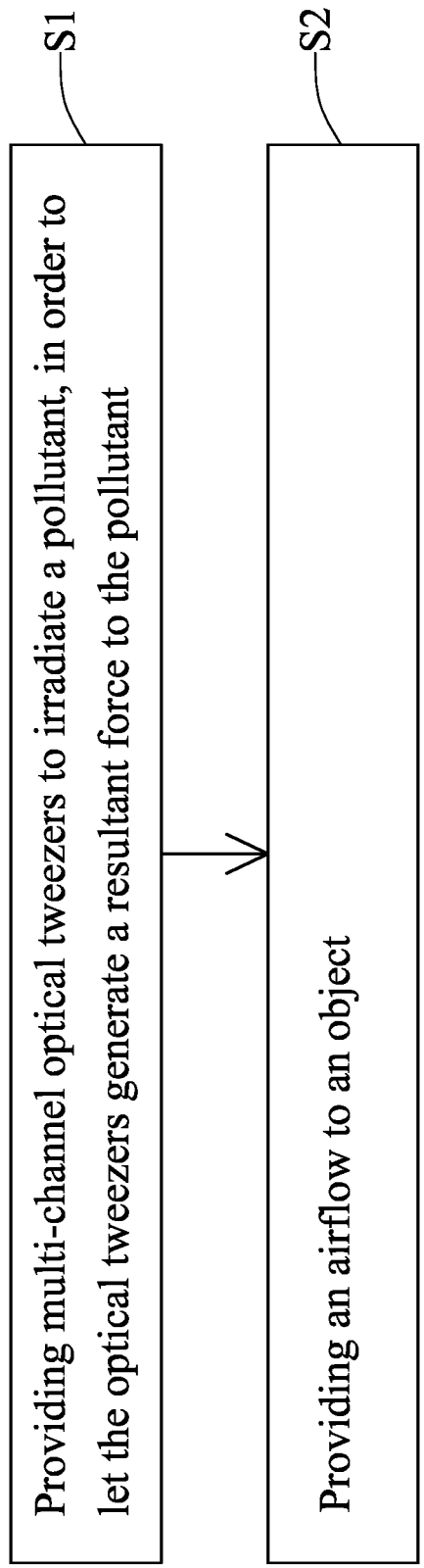
FIG. 2A illustrates a flow chart of method for cleaning the semiconductor process equipment of the embodiment of the present disclosure.
Figure 2B:
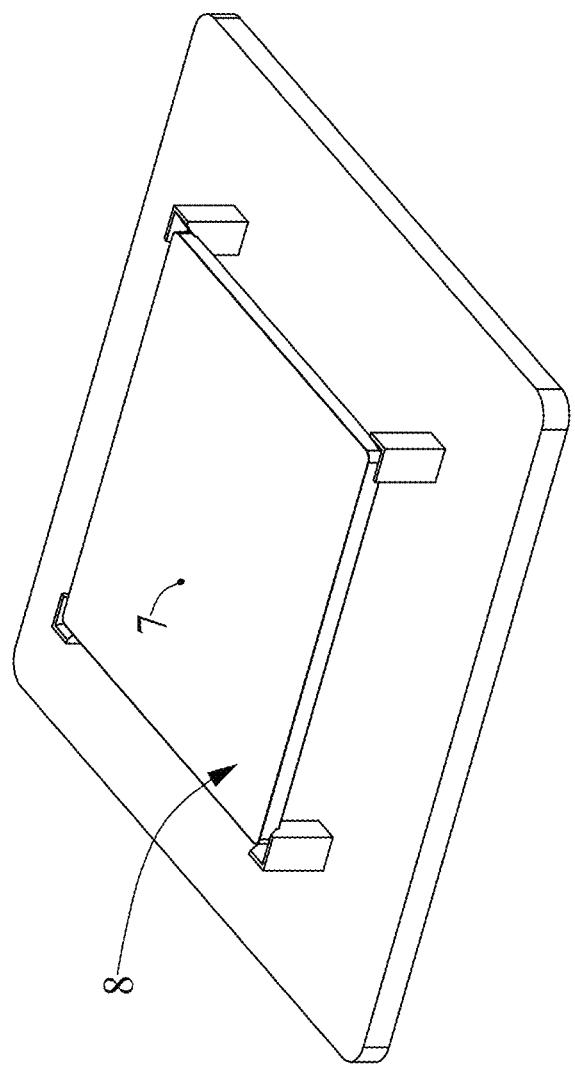
FIG. 2B illustrates a schematic view of the pollutant 7 attaching to the object 8 of the present disclosure.

With reference to FIG. 2A and FIG. 2B, which illustrate a flow chart of method for cleaning the semiconductor process equipment of the embodiment of the present disclosure, and a schematic view of the pollutant 7 attaching to the object 8 of the present disclosure. The embodiment is that the cleaning method for the semiconductor process equipment is applied to the object 8 and the cleaning system 10. Therefore, here is the detail of the cleaning method.

Figure 3A:
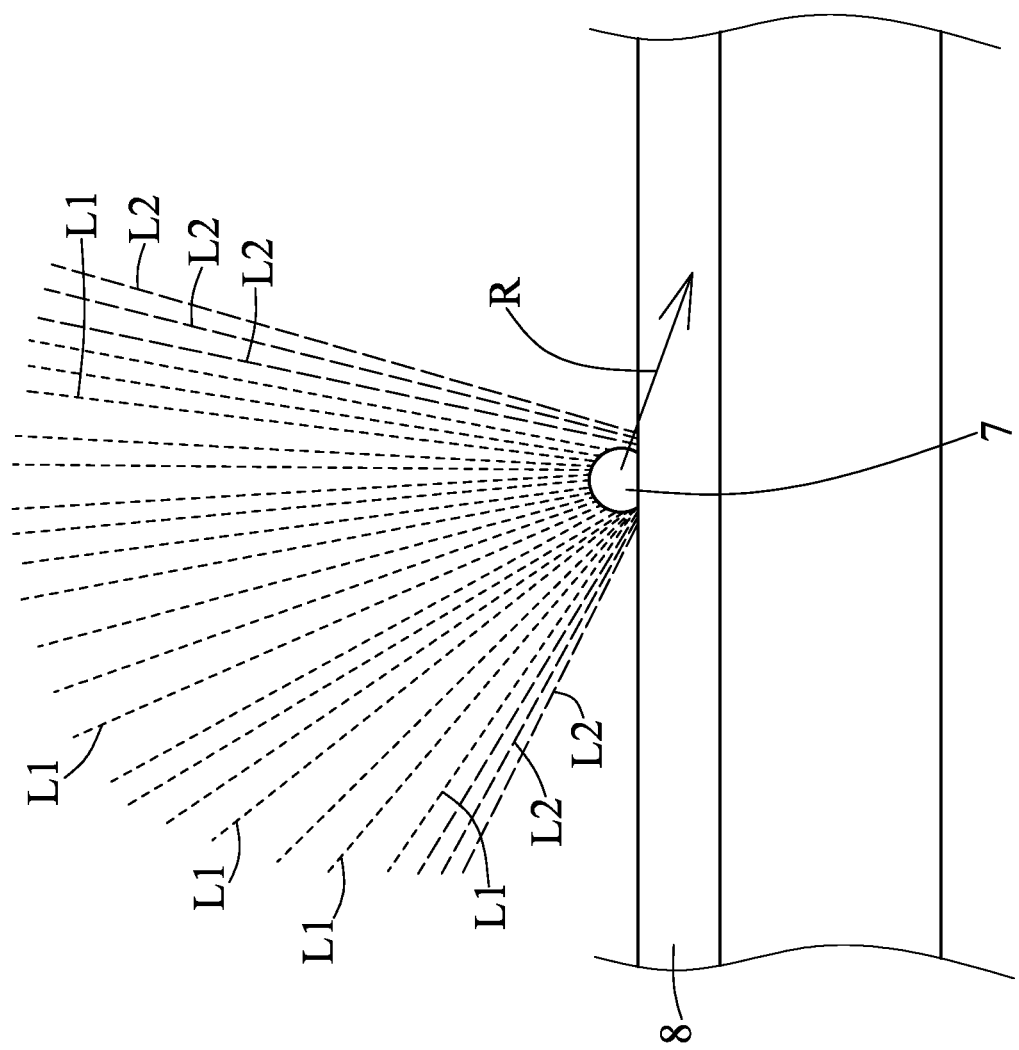
Figure 3B:
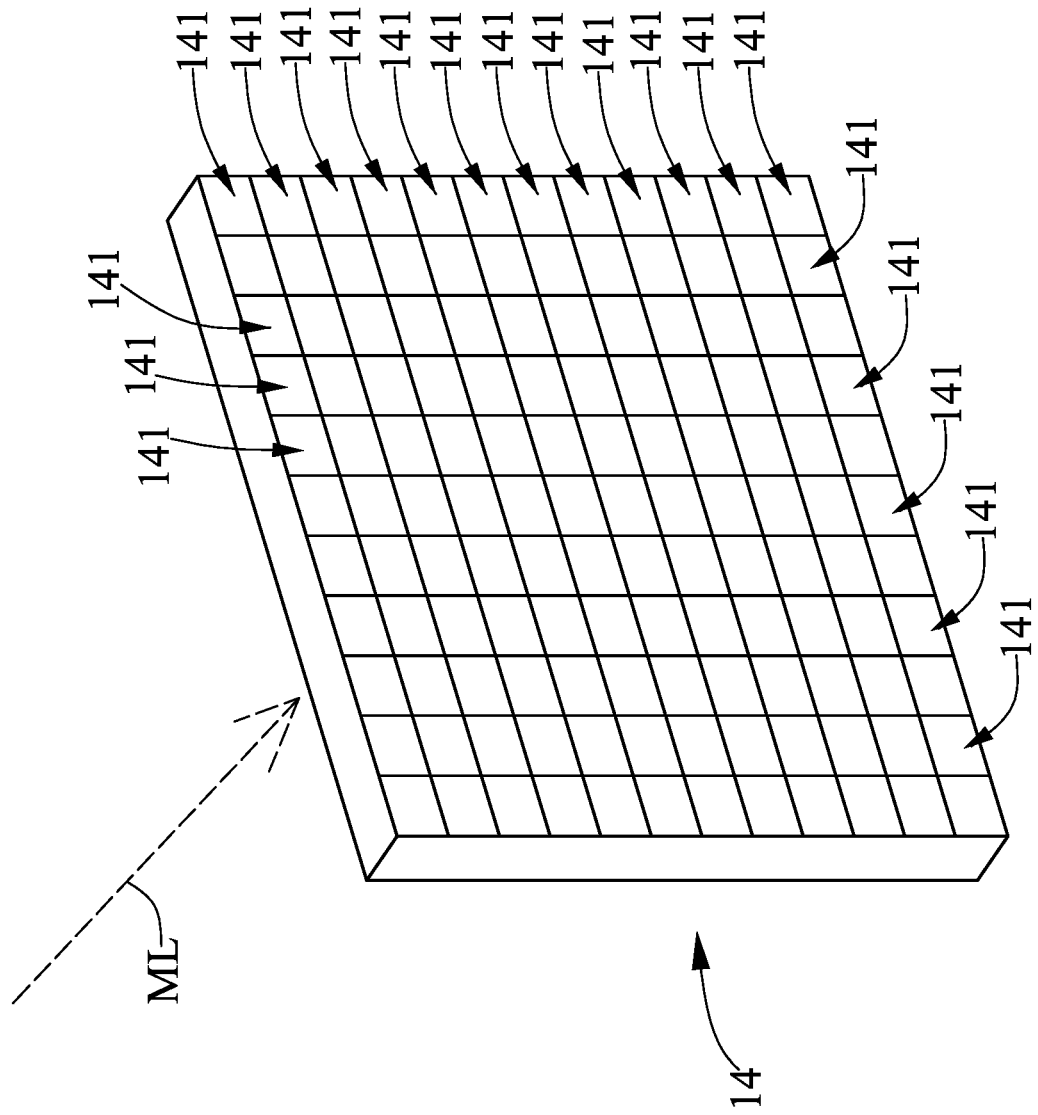
FIG. 3B illustrates a schematic view of a main laser light ML entering into a spatial light modulator 14.

First, referring to a step (S1), FIG. 3A and FIG. 3B, that is of providing multi-channel optical tweezers L1 to irradiate the pollutant 7 and multi-channel optical tweezers L2 to irradiate locations where the pollutant 7 is neighbor to, in order to let the optical tweezers L1, L2 generate a resultant force to the pollutant 7 (as shown in FIG. 3A). As a matter of fact, the optical tweezers L1, L2 are irradiated the pollutant 7 and the locations where the pollutant 7 is neighbor to from different directions and angles. As aforesaid, the cleaning system 10 discloses that the optical tweezers L1, L2 are formed by means of the main laser light ML entering into the spatial light modulator 14. More, a view plane of the spatial light modulator 14 is divided into a plurality of pixels 141 (as shown in FIG. 3B). Thus, when the main laser light ML goes into the spatial light modulator 14, these pixels 141 may divide the main laser light ML into multiple optical tweezers L1, L2, and each of the pixel 141 corresponds to one laser tweezer L1 or L2. Moreover, the spatial light modulator 14 is able to control the phase of the optical tweezers L1, L2 emitted by each of the pixel 141, so that the multiple optical tweezers L1, L2 with different directions and angles can focus on the pollutant 7 and the locations where the pollutant 7 is neighbor to.

The pollutant 7 is single to the embodiment for concise instructions. On the other hand, normally there are plural pollutants 7 attaching to the object 8. As it can be seen, the spatial light modulator 14 divides the main laser light ML into several sets of the optical tweezers L1 and the optical tweezers L2, and each set of the laser tweezer L1 has multiple channels, so do the optical tweezers L2. Each set of the optical tweezers L1 and the optical tweezers L2 corresponds to each set of the pixels 141. In other words, following will adopt one set of the optical tweezers L1 or the optical tweezers L2 for descriptions. For the people skilled in the art should understand that normally there are multiple sets of the optical tweezers L1 and the optical tweezers L2 irradiating different kinds of the pollutants 7 and the locations where the pollutant 7 are neighbor to.

In addition, since single light tweezer irradiates an object, a light pressure will be generated on the object. So that those multi-channel optical tweezers L1, which are applied to the pollutant 7, may produce a certain amount of the resultant force R, wherein the resultant force R is greater than a maximum static friction between the pollutant 7 and the object 8. That is why the resultant force R of the optical tweezers L1 is able to remove the pollutant 7, in order to separate the pollutant 7 from the object 8.

The optical tweezers L2 are full of energy, which has a modifying effect to the locations where the pollutant 7 is neighbor to. That is, the bonding force between the pollutant 7 and the object 8 is being decreased. That is to say the adhesion force of the pollutant 7 is reduced. In this way, the resultant force R of the optical tweezers L1 is helpful to remove the pollutant 7.

Figure 3C:
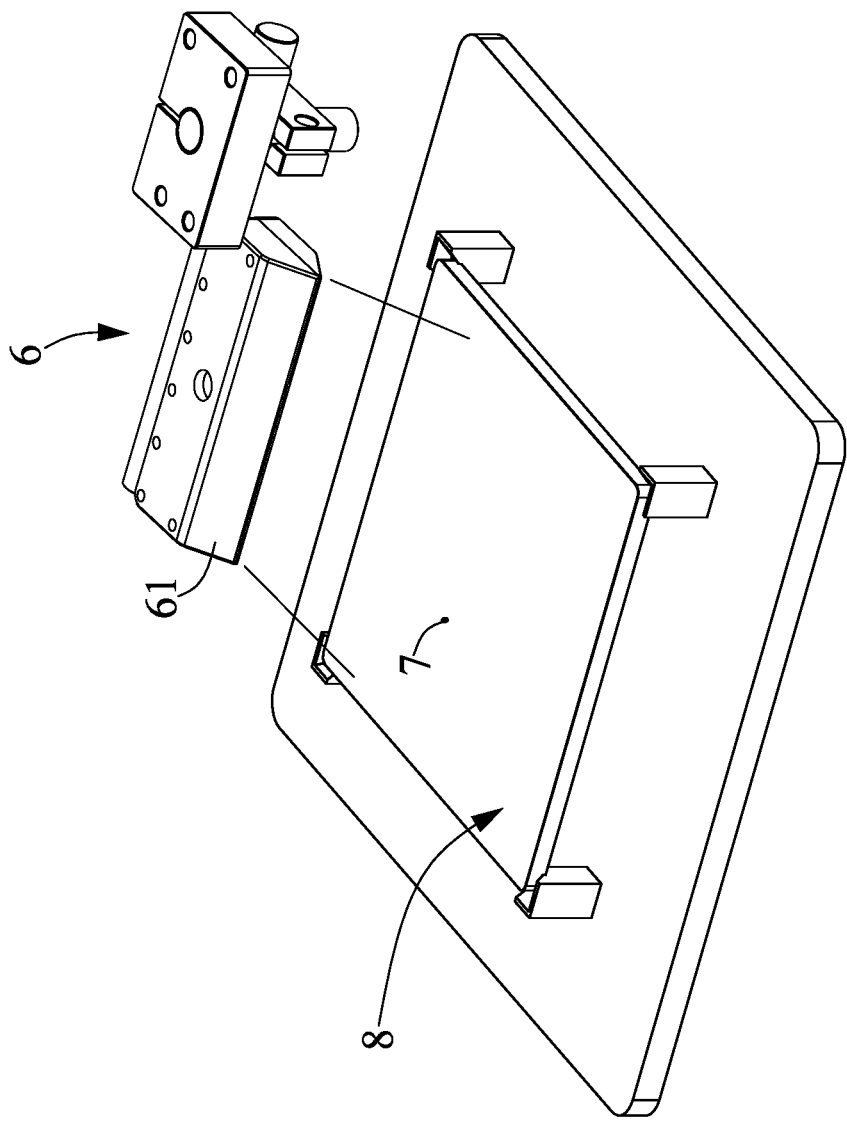
FIG. 3C illustrates a schematic view of an air knife device 6 generating an airflow to a photomask protective film 8.

Regarding to a step (S2) and FIG. 3C, that is to provide an airflow to the object 8. The airflow is sprayed from an air knife nozzle 61 of an air knife device 6. After that, the airflow goes to a photomask protective film (object 8). The pollutant 7 is separated from the object 8 in the step (S1), and it is resulting in that the pollutant 7 is easily removed by the airflow from the air knife device 6. Compared to aforesaid embodiment, the present embodiment is preferred since it reaches the best cleaning effect.

According to above cleaning method, the step (S1) and the step (S2) are executed in order, but some other cases may be not, which means the step (S1) and the step (S2) can be processed simultaneously. Specifically, when the multi-channel optical tweezers L1 irradiate the pollutant 7 and the locations where the pollutant 7 is adjacent to, the air knife device 6 is capable of eliminating dust for the object 8 without any sequence. Accordingly, cleaning photomask or photomask protective film is highly recommended.

As a conclusion, the method for cleaning semiconductor process equipment and the cleaning system thereof can effectively remove pollutants on photomasks or photomask protective films, and even much better if it is with an air knife device.

Although the disclosure has been disclosed and illustrated with reference to particular embodiments, the principles involved are susceptible for use in numerous other embodiments that will be apparent to a person having ordinary skill in the art. This disclosure is, therefore, to be limited only as indicated by the scope of the appended claims.

What is claimed is:

1. A method for cleaning semiconductor process equipment, adapted to apply to an object with at least one pollutant thereon, comprising steps of:
   providing multi-channel optical tweezers to irradiate a single one of the at least one pollutant and locations where the at least one pollutant is neighbor to, in order to let the optical tweezers generate a resultant force to the at least one pollutant; and
   providing an airflow to the object;
   wherein the resultant force is greater than a maximum static friction between the at least one pollutant and the object; and wherein the optical tweezers are applied from different directions.

2. The method for cleaning the semiconductor process equipment according to claim 1, wherein the step (b) is executed simultaneously when the step (a) is being executed.

3. The method for cleaning the semiconductor process equipment according to claim 1, wherein the object is a photomask or a photomask protective film.

4. The method for cleaning the semiconductor process equipment according to claim 1, wherein the optical tweezers are formed by means of a main laser light entering into a spatial light modulator.

* * * * *